United States Patent
Takahashi et al.

(10) Patent No.: US 6,362,014 B1
(45) Date of Patent: Mar. 26, 2002

(54) BONDING APPARATUS

(75) Inventors: Kuniyuki Takahashi, Musashimurayama; Hijiri Hayashi, Tokyo, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/687,842

(22) Filed: Oct. 13, 2000

Related U.S. Application Data

(62) Division of application No. 09/322,801, filed on May 27, 1999.

(30) Foreign Application Priority Data

May 27, 1998 (JP) .......................................... 10-161527

(51) Int. Cl.⁷ .......................... H01L 21/66; G01R 31/26
(52) U.S. Cl. ............................ 438/14; 438/16; 438/17; 438/18; 228/1.1; 228/4.5
(58) Field of Search ..................... 228/1.1, 4.5; 438/14, 438/16, 17, 18

(56) References Cited

U.S. PATENT DOCUMENTS 5,350,106 A * 9/1994 Fogal .......................... 228/103
5,360,155 A * 11/1994 Ookie et al. .................. 228/1.1
5,890,643 A * 4/1999 Razon et al. ................. 228/1.1

* cited by examiner

Primary Examiner—David Nelms
Assistant Examiner—Reneé R. Berry
(74) Attorney, Agent, or Firm—Koda & Androlia

(57) ABSTRACT

Instead of using the ordinary pulse train command inputted from a computer to the control circuit, an offset signal outputted from an offset compensation circuit is employed for performing scrubbing of a bonding surface of, for instance, a semiconductor device. The offset compensation circuit controls a DC motor in drive amounts smaller than the resolution of the DC motor which moves an XY table having a bonding tool which performs the scrubbing, and the drive amounts smaller than the resolution outputted from the offset compensation circuit are controlled by a computer.

3 Claims, 2 Drawing Sheets

SCRUBBING OPERATION

US 6,362,014 B1

BONDING APPARATUS

This is a Divisional Application of application Ser. No. 09/322,801, filed May 27, 1999.

BACKGROUND OF THE INVENTION

1. Field of the Invention

The present invention relates to a bonding apparatus and method for performing a scrubbing operation during bonding.

2. Prior Art

Performing a scrubbing operation by applying vibrations to a bonding tool during bonding is known in the past. This type of scrubbing operation is disclosed in, for example, Japanese Patent Application Laid-Open (Kokai) Nos. S60-70736 and S62-249437 (hereinafter referred to as Prior Art 1), Japanese Patent Application Laid-Open (Kokai) No. S63-239834 (hereinafter referred to as Prior Art 2), and Japanese Patent Nos. 2,530,224 and 2,565,009 (hereinafter referred to as Prior Art 3).

In Prior Art 1, before a bonding operation is executed, the regions to be joined on a lead frame are scrubbed by a scrubbing device which is a separate device from a bonding apparatus. The scrubbing operation is performed by applying ultrasonic vibrations to the ultrasonic horn of the bonding apparatus. Thus, since a scrubbing device is required in addition to the bonding apparatus, there is a major increase in the total cost of the bonding system as well as an increase in installation space. Also, since the scrubbing operation is performed by applying ultrasonic vibrations to an ultrasonic horn, only a reciprocal scrubbing operation in the direction of the axis of the ultrasonic horn can be performed.

In Prior Art 2, a piezoelectric element is provided on an ultrasonic horn, and the scrubbing operation is performed by applying voltage to the piezoelectric element so that the piezoelectric element oscillates. Since a piezoelectric element is thus provided on the ultrasonic horn of the bonding apparatus in Prior Art 2, there is no major increase in apparatus cost or increase in installation space as in Prior Art 1; however, a separate piezoelectric element and a drive circuit for driving the piezoelectric element are required. As a result, a corresponding increase in costs is inevitable in this Prior Art 2. Also, since the scrubbing operation is in the direction of expansion and contraction of the laminated piezoelectric element, only a linear reciprocal scrubbing operation in the direction of extension of the ultrasonic vibrations is performed just as in Prior Art 1.

In contrast, with Prior Art 3, the scrubbing operation is performed by a bonding tool provided on an XY table which is moved by, for instance, a DC motor and is a part of the bonding apparatus installed from the outset. Accordingly, there is no increase in apparatus cost, nor is there any increase in installation space. Also, since the scrubbing operation is carried out by driving the XY table, the scrubbing operation can be performed in a square pattern, a rectangular pattern, an elliptical pattern, a linear reciprocating pattern, or any other desired pattern. In other words, it is possible to select the scrubbing operation that is best-suited to the intended object.

However, the Prior Art 3 fails to disclose the control of the DC motor which drives the XY table though it teaches that the DC motor is controlled by a control circuit.

Accompanying FIG. 3 shows the control circuit for the DC motor of the Prior Art 3. In the FIG. 3, the DC motor 2 that drives the XY table 1 is controlled by a position sensor 3 that reads the position of the rotary shaft of the DC motor 2, the control circuit 10 includes a drive circuit of the DC motor 2, and a computer 4 controls the control circuit 10.

More specifically, a pulse train command 4a from the computer 4 is inputted to a position comparison circuit 11 and becomes a current command via a speed comparison circuit 12, an adder 13, and a drive circuit 14, thus driving the DC motor 2 and moving the XY table 1.

The movement of the rotary shaft of the DC motor 2 driven by the current command is detected by the position sensor 3. The output signal 3a of the position sensor 3 is converted into a speed signal 15a by a speed conversion circuit 15, after which it is inputted in the speed comparison circuit 12 so as to stabilize the control system. The output signal 3a of the position sensor 3 is also converted into a pulse by a pulse conversion circuit 16, after which it is inputted to the position comparison circuit 11. When the number of pulses of the input signal 16a becomes the same as the number of the pulse train command 4a from the computer 4, the operation to control the DC motor 2 is completed.

So as to stop the DC motor 2 at a specific location between pulses, the output signal 3a from the position sensor 3 is inputted to a clamp circuit 17, and a clamp signal 17a from the clamp circuit 17 is inputted to the adder 13. This will be explained with reference to FIG. 4.

FIG. 4(a) shows the one-pulse movement of the rotary shaft of the DC motor 2 caused by the pulse train command 4a of the computer 4. Here, "one-pulse movement" means that if the rotary shaft was within range A between pulses P1 and P2, for example, it has moved to range B between pulses P2 and P3 as a result of one pulse (from pulse P2 to P3) of movement. However, the position of the rotary shaft of the DC motor 2 cannot be fixed in this state.

Accordingly, as shown in FIG. 4(b), the clamp circuit 17 controls the rotary shaft of the DC motor so that the rotary shaft stops in the centers A1, B1, and so on; in other words, the rotary shaft stops between pulses P1 and P2, between pulses P2 and P3, and so on. More specifically, if the rotary shaft is stopped at the position of the center A1 and is moved one pulse, it will be moved to the position of the center B1. FIG. 4(b) shows the serrated output signal 3a produced by an encoder of the position sensor 3. This output signal 3a is the product of converting the distance from a given pulse to the next pulse (the amount of movement) to an electrical quantity.

Usually, the DC motor 2 stops between pulses or at the intermediate point of two pulses. Thus, when the output signal 3a is expressed as voltage, the distance from the leading edge of a pulse to the leading edge of the next pulse is expressed from a positive voltage +V to a negative voltage −V or vice versa, with the center being 0 V. For instance, if the motor is actuated in a state in which it is stopped with the output signal 3a at 0 V, and if the stopping position after actuation is not the 0 V position, then a voltage corresponding to this discrepancy is added to the adder 13 as the clamp signal 17a from the clamp circuit 17, and the output of the adder 13 is compensated so that the output signal 3a will be at the 0 V position; as a result, the motor stops at its intended position.

Since the operation of the DC motor 2 is controlled by the pulse train command 4a that is supplied by the computer 4, when the scrubbing operation is performed by controlling the XY table 1 as in the Prior Art 3, the scrubbing operation is also performed in one-pulse operational units just as in normal operation. In other words, since the resolution (such as 2.5 μm per pulse) is fixed in the control of an ordinary XY table 1, the scrubbing operation is performed only in these units, and the operation finer than one pulse that is required for the scrubbing operation cannot be carried out.

SUMMARY OF THE INVENTION

Accordingly, the object of the present invention is to provide a bonding apparatus and method which can make a driving control of the XY table in units smaller than the one-pulse units with which the XY table is driven for an ordinary bonding operation, thus allowing free setting of the amplitude and frequency of the scrubbing operation and good bonding to be carried out.

The above object is accomplished by a unique structure for a bonding apparatus that comprises an XY table having a bonding tool, a drive means (motor) for driving the XY table, a control circuit for controlling the drive means in drive amounts based on the units of resolution of the drive means, a position detection means for detecting the amount of movement of the XY table, and a computer for controlling the control circuit on the basis of the amount of movement of the XY table from the position detection means, thus performing scrubbing with the bonding tool by driving the XY table; and in the present invention, an offset compensation circuit for controlling the drive means in drive amounts smaller than the resolution of the drive means is installed, and when the scrubbing is performed by the bonding tool of the XY table, the computer controls the offset compensation circuit so that the offset compensation circuit generates an output that provides a driving amount smaller than the resolution of the drive means, thus controlling the drive means with such an output.

The above object is also accomplished by a unique bonding method used in a bonding apparatus that comprises an XY table having a bonding tool, a drive means (motor) for driving the XY table, a control circuit for controlling the drive means in drive amounts based on the units of resolution of the drive means, a position detection means for detecting the amount of movement of the XY table, and a computer for controlling the control circuit on the basis of the amount of movement of the XY table from the position detection means, thus performing scrubbing with the bonding tool by driving the XY table, and in the present invention, the scrubbing is performed by way of an output of an offset compensation circuit that is provided in the control circuit, and the output of the offset compensation circuit provides a driving amount which is smaller than the resolution of the drive means.

DETAILED DESCRIPTION OF THE PREFERRED EMBODIMENTS

Figure 3:
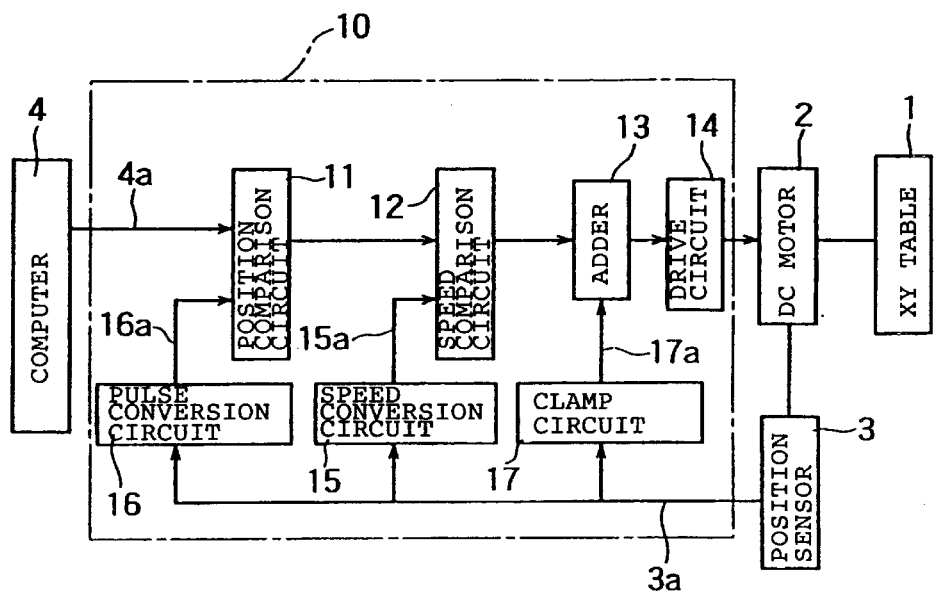
FIG. 3 is a block diagram illustrating the control circuit used in a conventional bonding apparatus.
Figure 4:
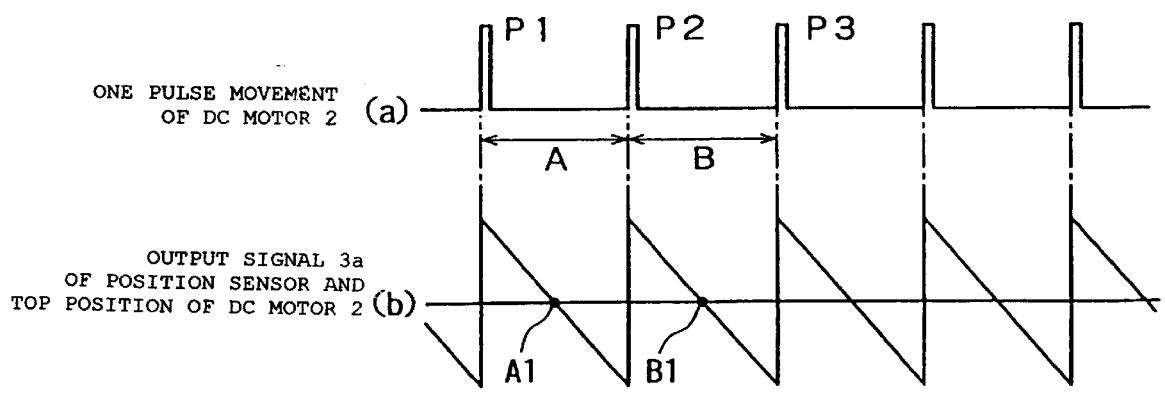
FIG. 4 is a diagram illustrating the control of the DC motor in FIG. 3.

An embodiment of the present invention will be described with reference to FIGS. 1 and 2. Those elements that are the same as or equivalent to those in FIGS. 3 and 4 showing prior art are given the same symbols, and their detailed description will not be repeated.

Figure 1:
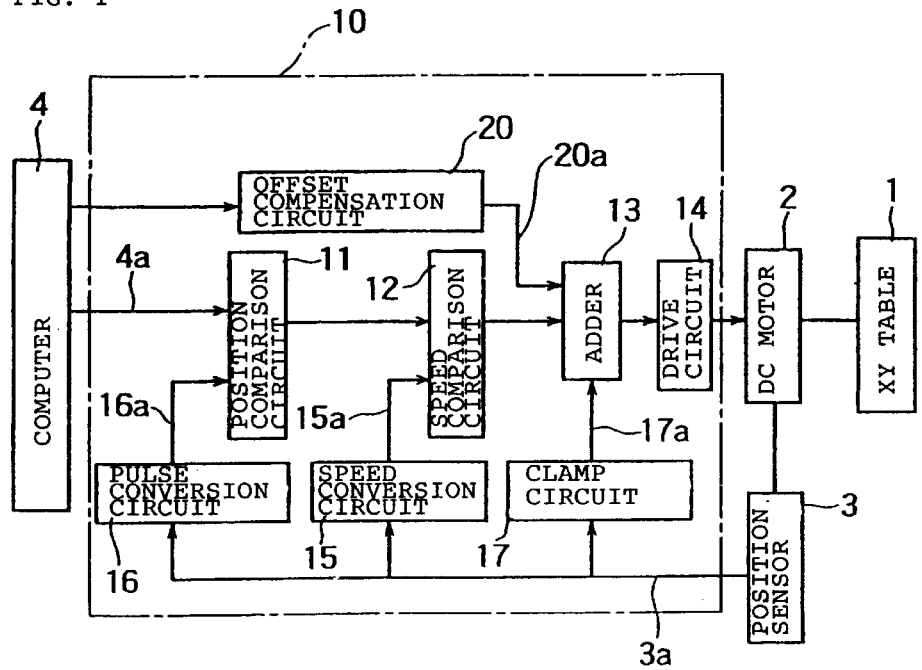
FIG. 1 is a block diagram illustrating an embodiment of the control circuit used in the bonding apparatus of the present invention.
Figure 2:
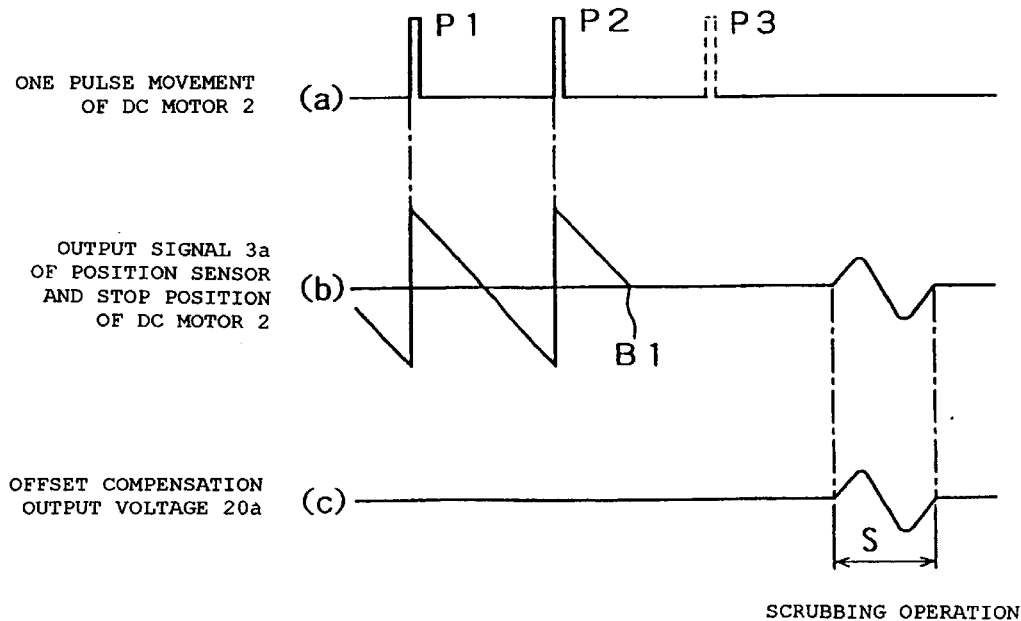
FIG. 2 is a diagram illustrating the control of the DC motor in FIG. 1.

As seen from FIGS. 1 and 2, in the present invention, an offset compensation circuit 20 which is controlled by the computer 4 is provided in the control circuit 10, and the output signal 20a of this offset compensation circuit 20 is inputted to the adder 13 so as to drive the DC motor 2. The remaining structure of the present invention is the same as that of the prior art shown in FIG. 3.

With the structure above, when the scrubbing operation is performed, the pulse train command 4a is not outputted from the computer 4, and the DC motor 2 is not driven by this pulse train command 4a; instead, the computer 4 controls the offset compensation circuit 20 so as to increase and decrease the output signal 20a of the offset compensation circuit 20. As a result, the DC motor 2 is operated for the scrubbing operation, which is a reciprocal operation and moves the XY table 1 that has a bonding tool (not shown), irrespective of the operation in one-pulse units (P1, P2, P3, . . . ) shown in FIG. 2(a) produced by the pulse train command 4a from the computer 4 used for an ordinary bonding operation.

A more specific description will be given below. In the following, it is assumed that the scrubbing operation is performed between pulses P2 and P3 shown in FIG. 2(a).

Since the pulse train command 4a is not outputted from the computer 4, the DC motor 2 stops at the center position B1 which is between pulses P2 and P3 as shown in FIG. 2(b). Then, when the output signal 20a of the offset compensation circuit 20 is controlled by the computer 4 and this output signal 20a is inputted in the adder 13, the rotating shaft (not shown) of the DC motor 2, as shown in FIG. 2(c), is rotated in accordance with the output signal 20a of the offset compensation circuit 20 from the center B1 in the S interval, thus moving the XY table 1. Therefore, by setting the output signal 20a of the offset compensation circuit 20 to be smaller than the one-pulse output value of the pulse train command 4a from the computer 4, the XY table 1 is moved in a finer fashion than the ordinary one-pulse movement. In this case, the size and period of the output signal 20a of the offset compensation circuit 20 can be changed. Thus, since the amplitude and frequency of the scrubbing operation can be freely set, the scrubbing operation can be carried out so as to be best-suited to the workpiece to be bonded, thus allowing good bonding to be performed.

In the above description, the pulse train command 4a indicates a moving distance by way of the pulse number, and the output signal 20a indicates positions between pulses; and in FIGS. 2(b) and 2(c), the waveforms shows voltages and not pulses.

The description in the above embodiment is made with reference to the DC motor 2 used as the driving means that drives the XY table 1, but an AC motor, a pulse motor, or a linear motor can be used instead.

As seen from the above, according to the present invention, the ordinary pulse train command inputted from the computer to the control circuit is not used for scrubbing; instead, the scrubbing is performed by an offset signal that is outputted from the offset compensation circuit by the computer so as to control the operation of the drive means (a drive means for driving the XY table); as a result, a drive control can be done by smaller units than the one-pulse units that are used for driving the XY table for a bonding operation. Thus, the amplitude and frequency of the scrubbing operation can be set as desired, allowing good bonding to be performed.

What is claimed is:

1. A bonding apparatus comprising an XY table having a bonding tool, a drive means for driving said XY table, a control circuit for controlling said drive means in drive amounts based on units of resolution of said drive means, a position detection means for detecting an amount of movement of said XY table, and a computer for controlling said control circuit based on said amount of movement of said XY table from said position detection means, thus performing scrubbing with said bonding tool by driving said XY table, wherein said bonding apparatus further comprises an offset compensation circuit provided in said control circuit so as to control said drive means in drive amounts smaller than said resolution of said drive means, and wherein when scrubbing is performed by said bonding tool of said XY table, said computer controls said offset compensation circuit so that said offset compensation circuit generates an output that provides a driving amount smaller than said resolution of said drive means, thus controlling said drive means with said output.

2. The bonding apparatus according to claim 1 wherein during scrubbing said computer provides a driving amount less than one unit of resolution of said drive means.

3. The bonding apparatus according to claim 1 wherein said drive means is selected from the group consisting a DC motor, AC motor, a pulse motor and a linear motor.

* * * * *